United States Patent
Hshieh

(10) Patent No.: US 7,629,646 B2
(45) Date of Patent: Dec. 8, 2009

(54) TRENCH MOSFET WITH TERRACED GATE AND MANUFACTURING METHOD THEREOF

(75) Inventor: Fwu-Iuan Hshieh, Saratoga, CA (US)

(73) Assignee: Force MOS Technology Co., Ltd., SMB (KY)

( * ) Notice: Subject to any disclaimer, the term of this patent is extended or adjusted under 35 U.S.C. 154(b) by 0 days.

(21) Appl. No.: 11/749,463

(22) Filed: May 16, 2007

(65) Prior Publication Data
US 2008/0042194 A1 Feb. 21, 2008

Related U.S. Application Data

(60) Provisional application No. 60/838,017, filed on Aug. 16, 2006.

(51) Int. Cl.
*H01L 27/088* (2006.01)

(52) U.S. Cl. .......... 257/330; 257/377; 257/382; 257/412; 257/413; 257/518; 257/520; 257/554; 257/576; 257/755; 257/411; 257/E29.255; 257/E21.409; 438/270; 438/589; 438/197; 438/287; 438/296

(58) Field of Classification Search .......... None
See application file for complete search history.

(56) References Cited

U.S. PATENT DOCUMENTS

| | | | |
|---|---|---|---|
| 6,413,822 B2 | 7/2002 | Williams et al. | |
| 6,455,378 B1 | 9/2002 | Inagawa et al. | |
| 6,462,376 B1 | 10/2002 | Wahl et al. | |
| 6,610,578 B2 | 8/2003 | Norstrom et al. | |
| 6,657,256 B2 | 12/2003 | Hshieh et al. | |
| 6,884,683 B2 | 4/2005 | Hshieh et al. | |
| 6,888,196 B2 | 5/2005 | Kobayashi | |
| 6,924,198 B2 * | 8/2005 | Williams et al. | 438/270 |
| 2001/0012655 A1 | 8/2001 | Nordstom et al. | |
| 2002/0192905 A1 | 12/2002 | Sekiguchi et al. | |
| 2002/0195657 A1 | 12/2002 | Williams et al. | |
| 2004/0021174 A1 | 2/2004 | Kobayashi | |
| 2004/0026753 A1 | 2/2004 | Matsuki et al. | |
| 2004/0253789 A1 | 12/2004 | Haase | |
| 2005/0196927 A1 | 9/2005 | Wang et al. | |

(Continued)

OTHER PUBLICATIONS

Co-pending U.S. Appl. No. 11/736,150, filed Apr. 17, 2007.

(Continued)

*Primary Examiner*—Minh-Loan T Tran
*Assistant Examiner*—Fei Fei Yeung Lopez
(74) *Attorney, Agent, or Firm*—Hamre, Schumann, Mueller & Larson, P.C.

(57) ABSTRACT

A trench metal oxide semiconductor field effect transistor (MOSFET) with a terraced trench gate. An epitaxial layer with a plurality of trenches is provided and a gate oxide layer is covered the sidewalls and bottoms of the trenches. A polysilicon layer is filled in the trenches, wherein the polysilicon layer is higher than the sidewalls of the trenches to be used as a gate of the MOSFET. A plurality of sources and bodies are formed in the epitaxial layer, and the bodies at both sides of the trenches. An insulating layer is covered on the substrate, wherein a plurality of metal contact windows are provided. Metal plugs are filled in the metal contact windows to form metal connections for the MOSFET.

5 Claims, 17 Drawing Sheets

U.S. PATENT DOCUMENTS

2006/0220141 A1 10/2006 Besser
2006/0273388 A1* 12/2006 Yamazaki ................... 257/330
2007/0190728 A1 8/2007 Sreekantham et al.
2008/0061357 A1 3/2008 Sakuma et al.
2008/0150021 A1 6/2008 Koops et al.

OTHER PUBLICATIONS

Co-pending U.S. Appl. No. 11/749,391, filed May 16, 2007.

* cited by examiner

TRENCH MOSFET WITH TERRACED GATE AND MANUFACTURING METHOD THEREOF

CROSS REFERENCE

The present application claims the priority of U.S. provisional application Ser. No., 60/838,017, which was filed on Aug. 16, 2006.

FIELD OF THE INVENTION

The present invention relates to a trench MOSFET structure and manufacturing method thereof, and more particularly, to a trench MOSFET structure with a terraced gate and manufacturing method thereof.

BACKGROUND OF THE INVENTION

Referring to FIG. 1, as described in U.S. Pat. Nos. 6,462,376 and 6,888,196, an epitaxial layer 105 with a plurality of trenches is formed on a substrate 100. The sidewalls and bottoms of the trenches are covered with oxide layer 115. There are p-type doping regions 110 (P-body) and n+ doping regions (n+ source) formed in the epitaxial layer, and a p+ doping region at the bottom of the trench contact for ohmic contact to P-body. The trenches are filled with N+ doped polysilicon layer to form gate structures 120. The gate structure 120 and the P-type doping regions 110 (P-body) are connected to metal plugs 125, and in turns to a respective gate metal pad 130 and source metal pad 140 used as metal connections for the trench MOSFET.

In the cross-sectional schematic diagram of the trench MOSFET of FIG. 1, during formation of the gate structures 120, a layer of polysilicon material is deposited on top of silicon mesa and into trench after gate oxide is grown by a chemical vapor deposition (CVD) process. Thereafter, the excess polysilicon material above silicon mesa is removed by a back-etching process, thereby forming gate structures inside the trenches. During filling of the polysilicon material in the trenches, a polysilicon seam A may be inherently formed in the middle of the gate structure 120 due to structure imperfections resulted by CVD process, thus it may cause problems such as short circuit in metal connections when metal plugs 125 formed as the metal contacts for the gate structures.

Referring to FIG. 2, a schematic top view of the gate structure 120 and the metal plug 125 is shown, wherein the gate structure 120 has a polysilicon hole at intersection of three polysilicon seams A. If the metal plug 125 is located on top of the polysilicon hole, then the metal plug 125 may penetrate the gate structure. Referring to FIG. 3, another schematic top view of the gate structure is shown, wherein the metal plug is located at one polysilicon seam of the gate structure, thus the problem with short-circuit between gate/drain may be alleviated. However, this still requires the metal plug 125 to be precisely positioned to avoid any polysilicon seam for better yield and reliability.

Referring to FIGS. 4A and 4B, cross-sectional schematic diagrams of the gate structure 120 are shown. As can be seen, the gate structure has a polysilicon seam A, if the metal plug 125 overlaps this polysilicon seam A, the metal plug 125 may be formed with a penetration 126, which penetrates the gate structure 120 to the oxide layer 115, thereby forming a short-circuited region 127.

Therefore, there a need for manufacturing a trench MOSFET that solves the problem related to poor gate contact.

Moreover, the prior arts forming gate structures inside the trenches, have higher gate resistance Rg when trench width becomes narrower and shallower for lower gate charge to achieve higher switching speed.

SUMMARY

A trench metal oxide semiconductor field effect transistor (MOSFET) with a terraced gate for high switch speed is disclosed. A substrate with a plurality of trenches is provided and a gate oxide layer is covered the sidewalls and bottoms of the trenches. A polysilicon layer is filled in the trenches, wherein the polysilicon layer is higher than the sidewalls of the trenches to be used as a gate of the MOSFET. The Rg is thus reduced because the terrace gate provides more polysilicon as gate material than the conventional trench gate. A plurality of source and body regions is formed in the epi. An insulating layer is covered on the substrate, wherein a plurality of metal contact windows are provided. Metal plugs are filled in the metal contact windows to form metal connections for the MOSFET.

BRIEF DESCRIPTION OF THE DRAWINGS

The present invention can be more fully understood by reading the following detailed description of the preferred embodiments, with reference made to the accompanying drawings, wherein.

DETAILED DESCRIPTION OF THE EMBODIMENTS

Figure 1:
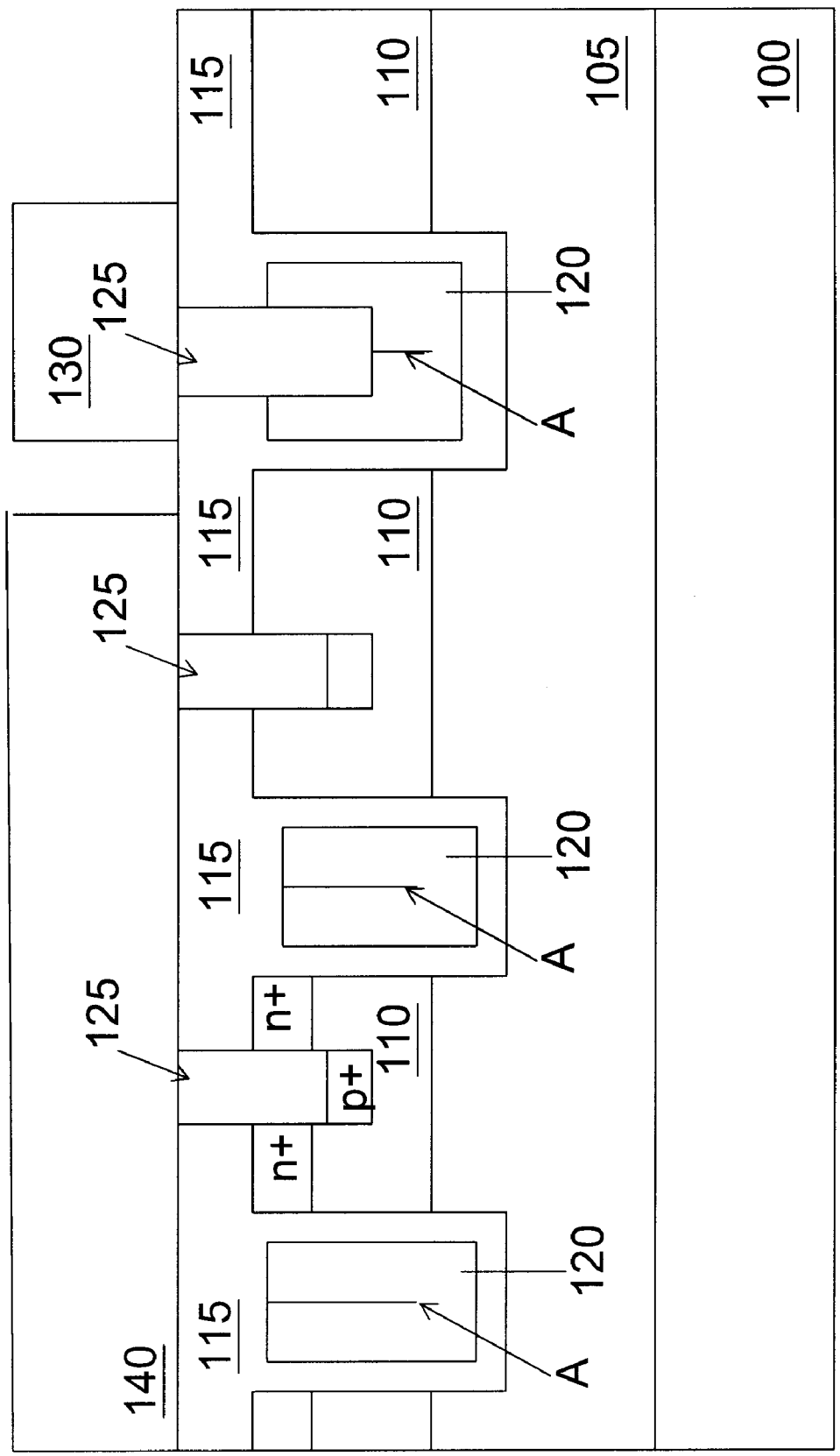
FIG. 1 is a cross-sectional schematic diagram depicting a traditional trench MOSFET, wherein a tungsten metal plug is used as a metal connection for the gate structure of the MOSFET.
Figure 2:
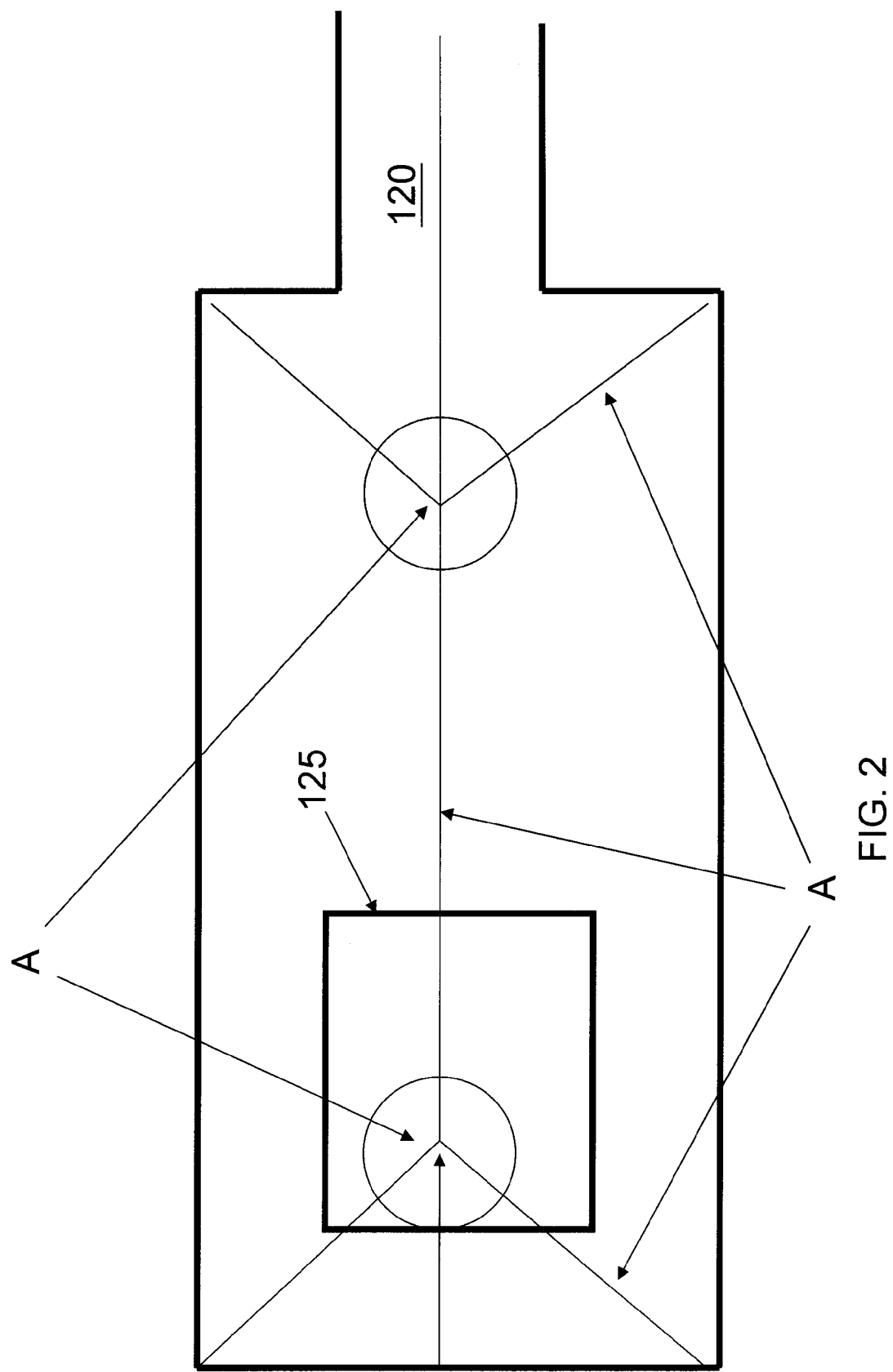
FIG. 2 is a planar schematic diagram of the tungsten metal plug and the gate of FIG. 1, wherein the tungsten metal plug is positioned at a polysilicon hole of the gate structure.
Figure 3:
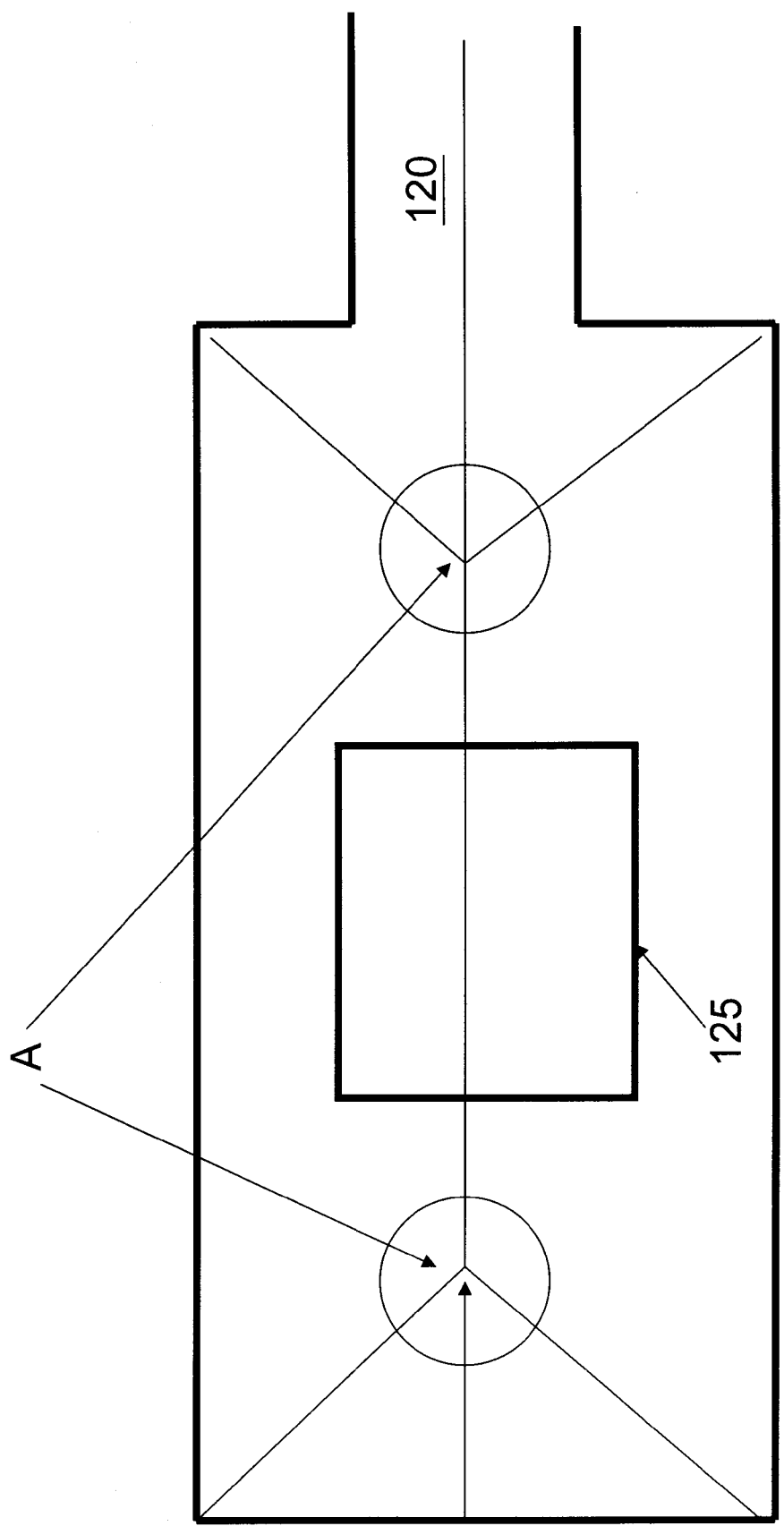
FIG. 3 is a planar schematic diagram of the tungsten metal plug and the gate of FIG. 1, wherein the tungsten metal plug is positioned at polysilicon seam of the gate structure.
Figure 4A:
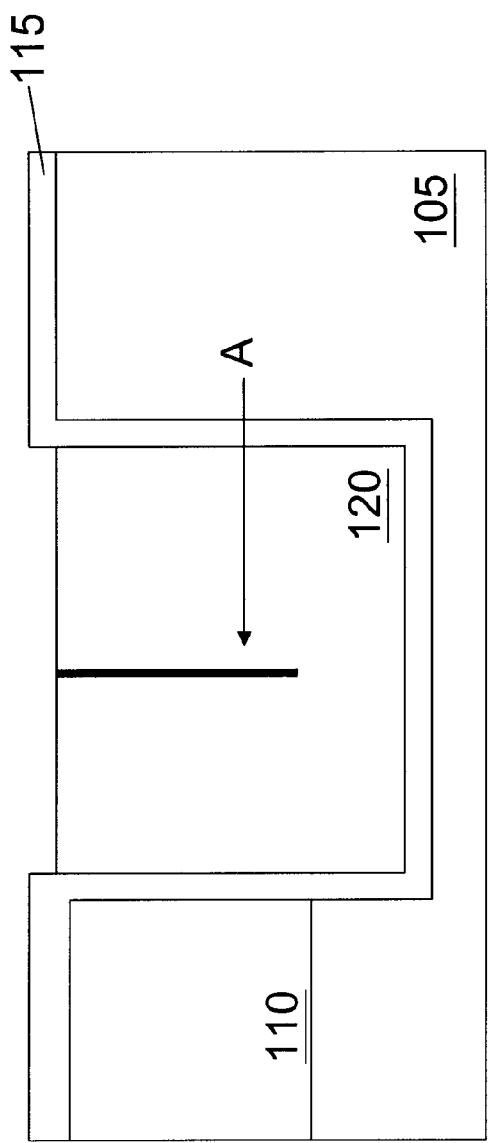
FIGS. 4A and 4B are cross-sectional schematic diagrams depicting a polysilicon seam of a gate structure and a tungsten metal plug formed at the polysilicon seam.
Figure 4B:
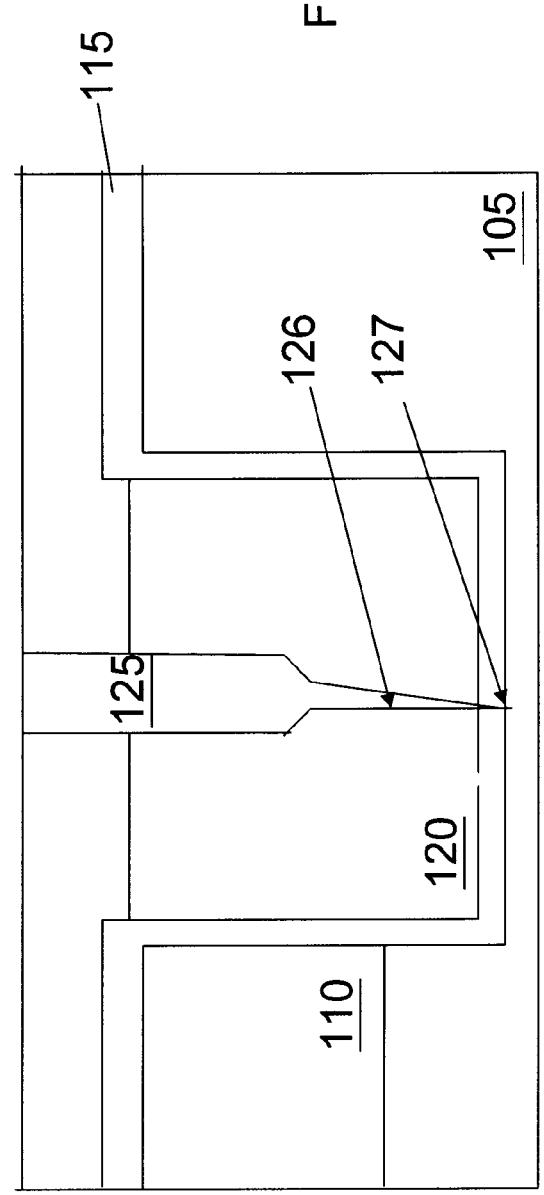
Figure 5:
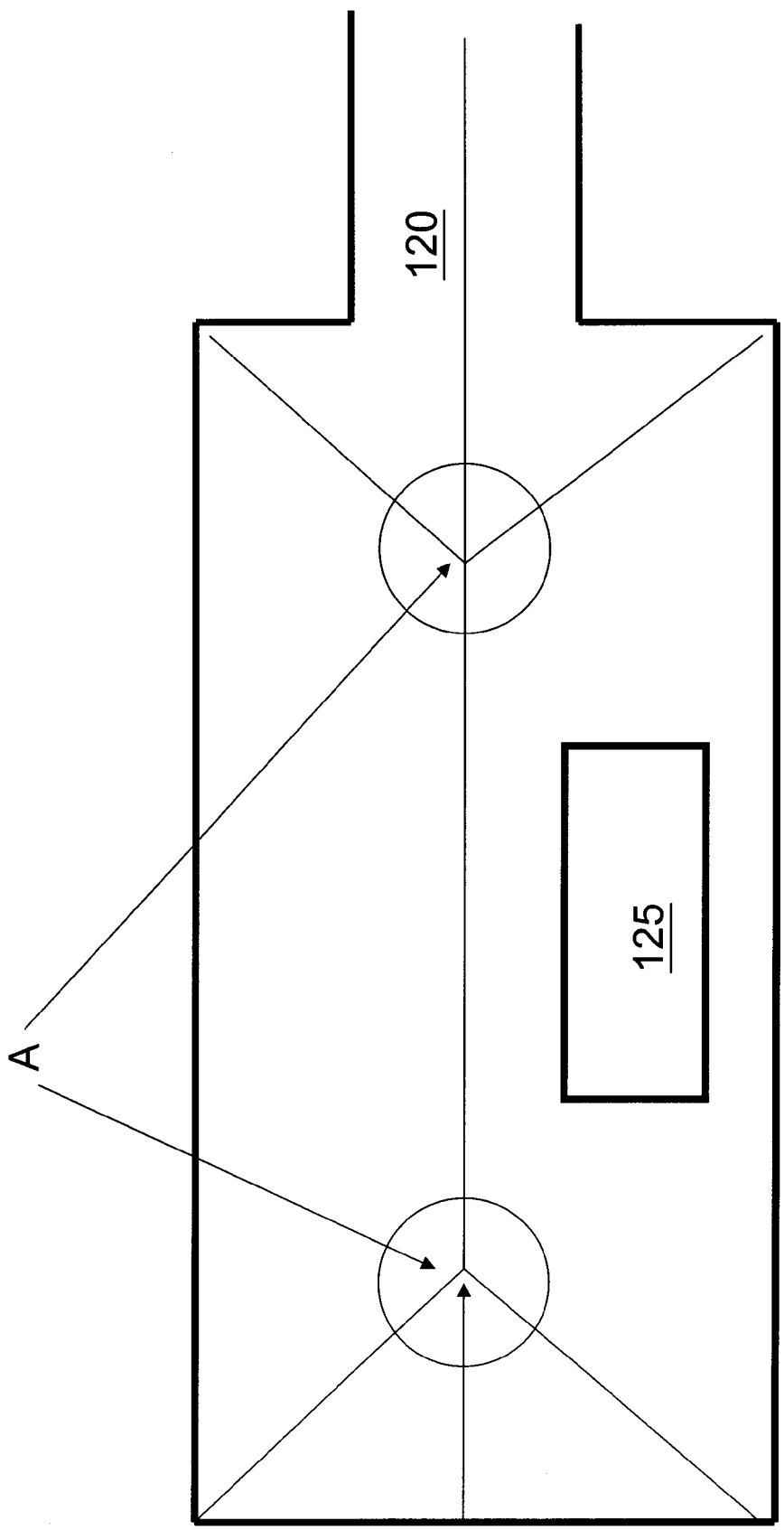
FIG. 5 is a planar schematic diagram depicting a tungsten metal plug and a gate structure according to an embodiment of the present invention, wherein the tungsten metal plug avoids the polysilicon seams of the gate structure.

Referring to FIG. 5, a top view depicting a gate structure 120 and a metal plug is shown, in which the metal plug is at a side of the gate structure 120 in order to avoid polysilicon seams A in the gate structure 120 and not affected by them.

Figure 6:
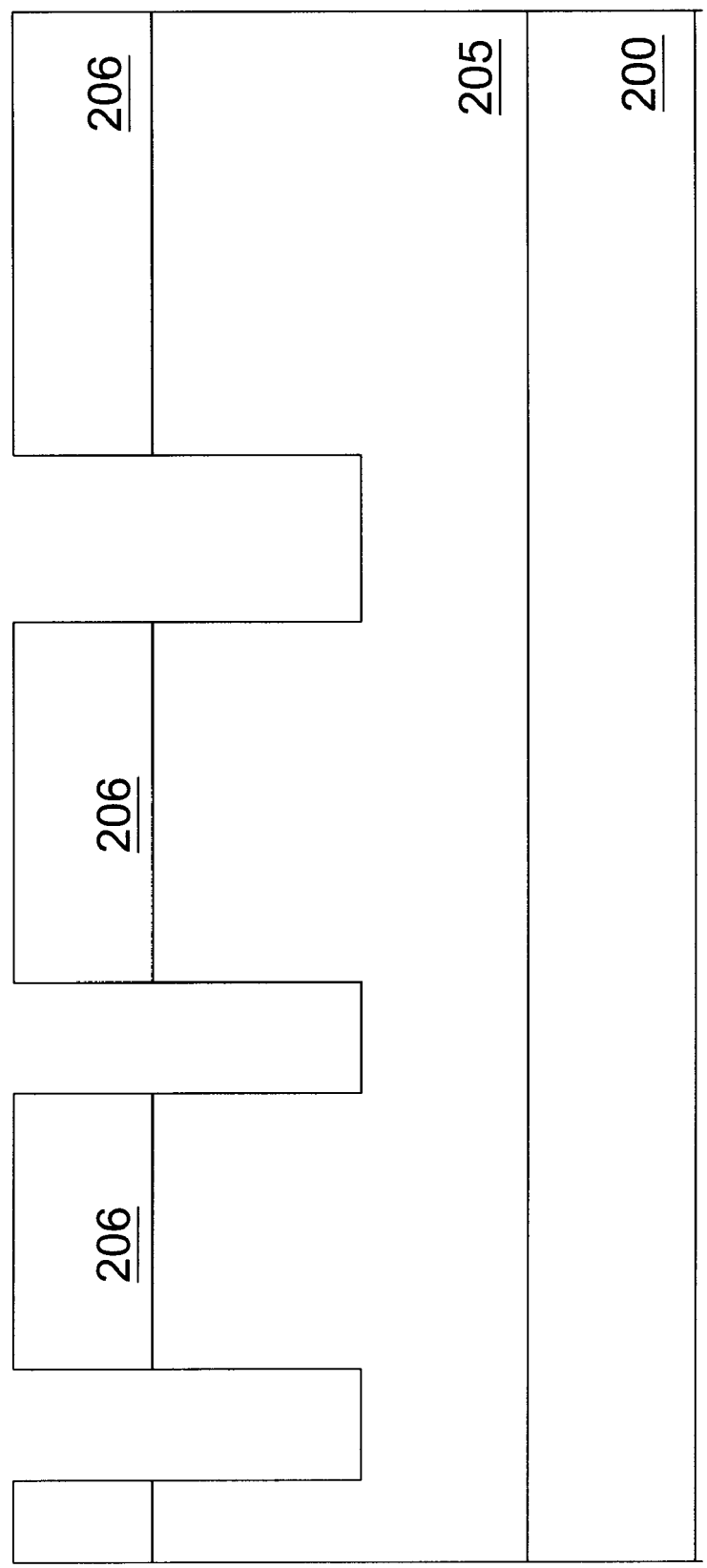
FIGS. 6 to 14 are cross-sectional schematic diagrams illustrating forming a trench MOSFET on a substrate according to a first embodiment of the present invention, wherein a terraced gate structure is connected to a tungsten metal plug.

Referring to FIGS. 6 to 14, cross-sectional schematic diagrams illustrating forming a trench MOSFET on a substrate according to a first embodiment of the present invention are shown. Referring to FIG. 6, a substrate 200 is provided with an epitaxial layer 205 formed thereon. Then, a thick oxide layer 206 is formed on the epitaxial layer 205. A plurality of trenches is formed in the epitaxial layer 205 and the oxide layer by lithography and dry etching processes.

Figure 7:
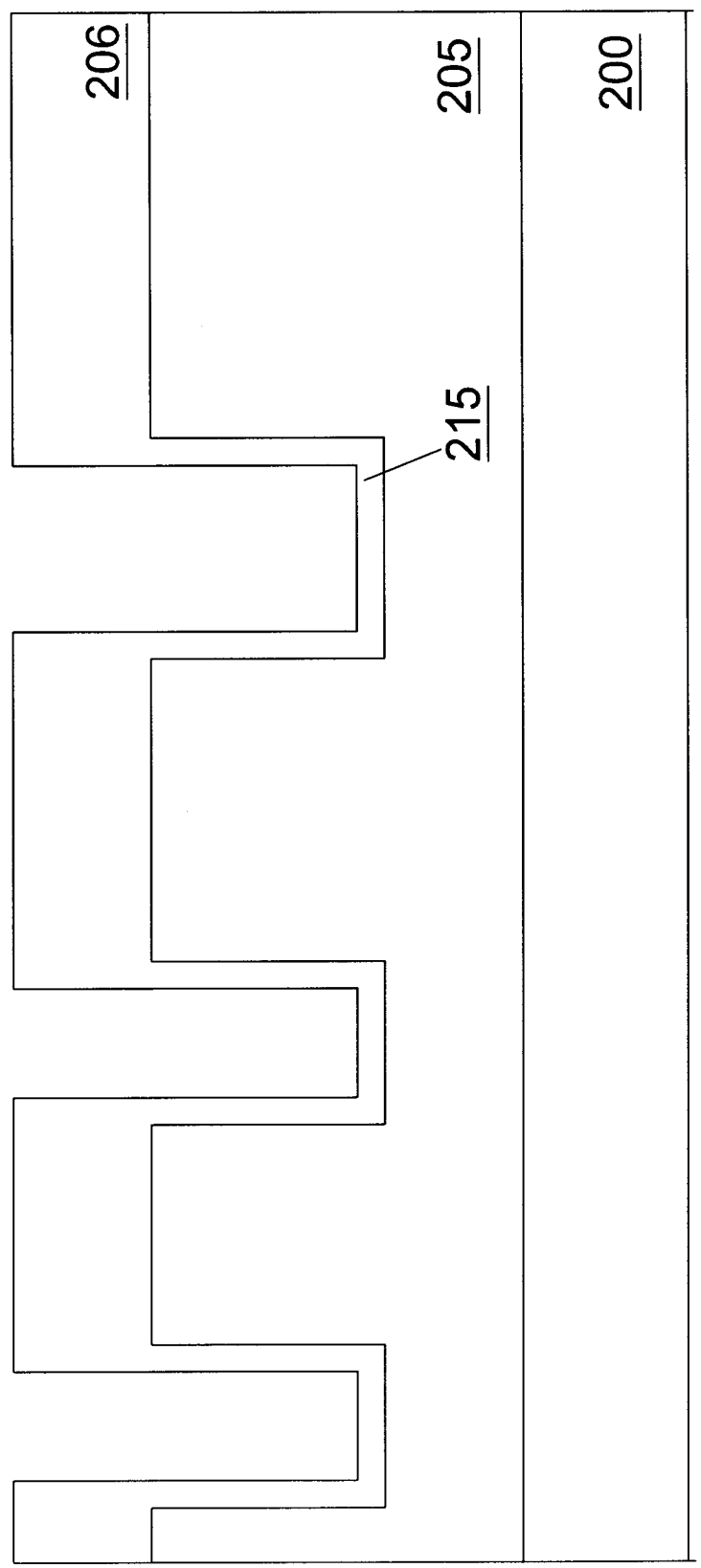
Figure 8:
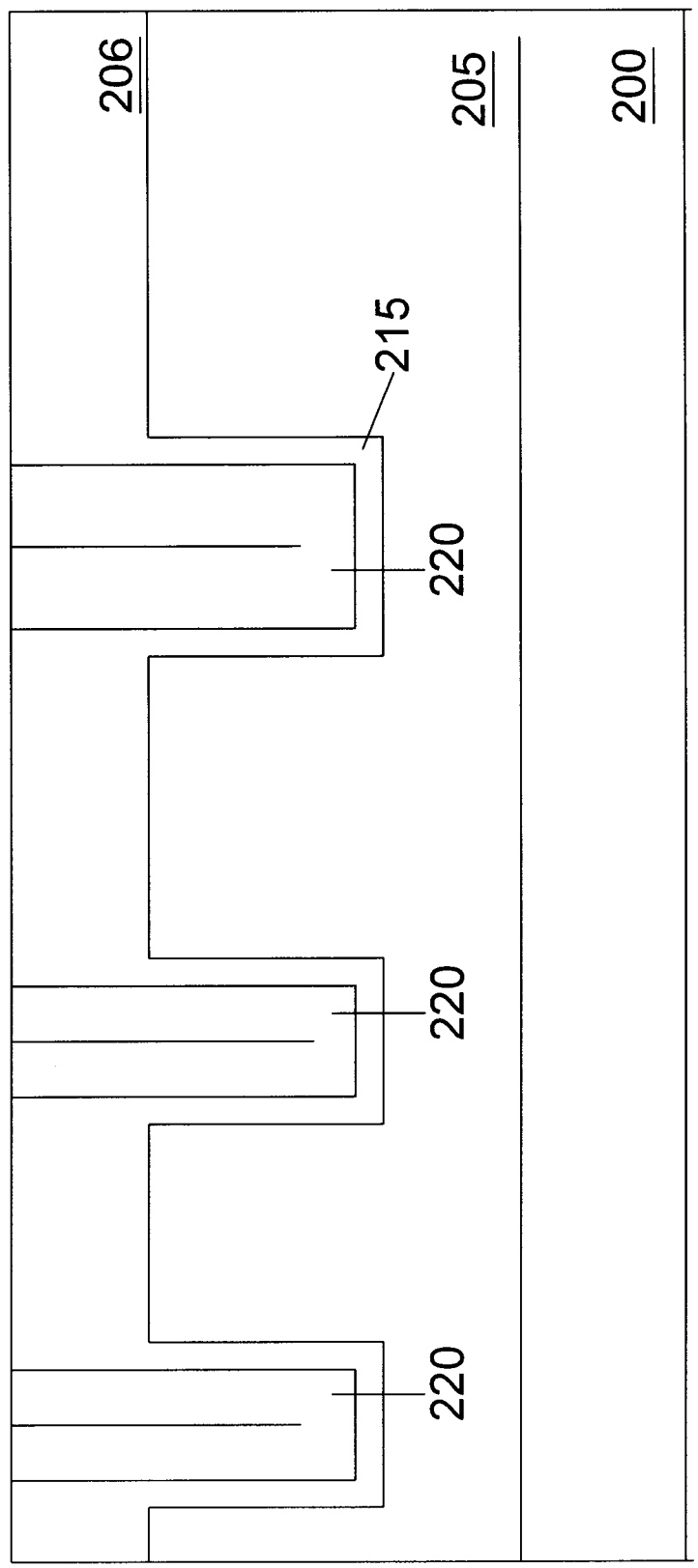

Referring to FIG. 7, after growing and removing sacrifical oxide, a gate oxide layer 215 is formed covering the sidewalls and bottoms of the trenches. Referring to FIG. 8, a polysilicon material is then deposited on the oxide layer 215 and filled in the trenches. Thereafter, a portion of the oxide layer 215 on the polysilicon material is removed by a back-etching process, thus forming gate structures 220 of the trench MOSFET.

Figure 9:
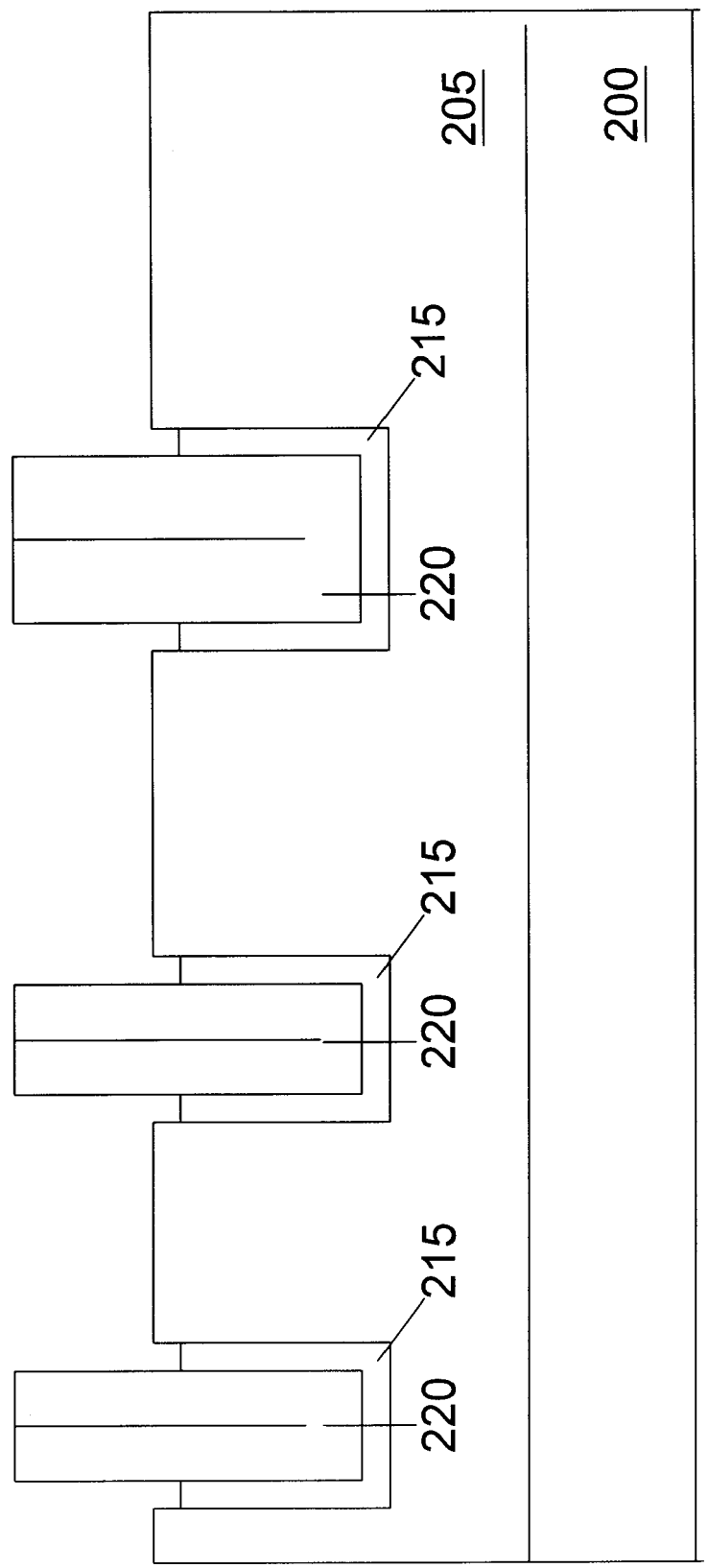
Figure 10:
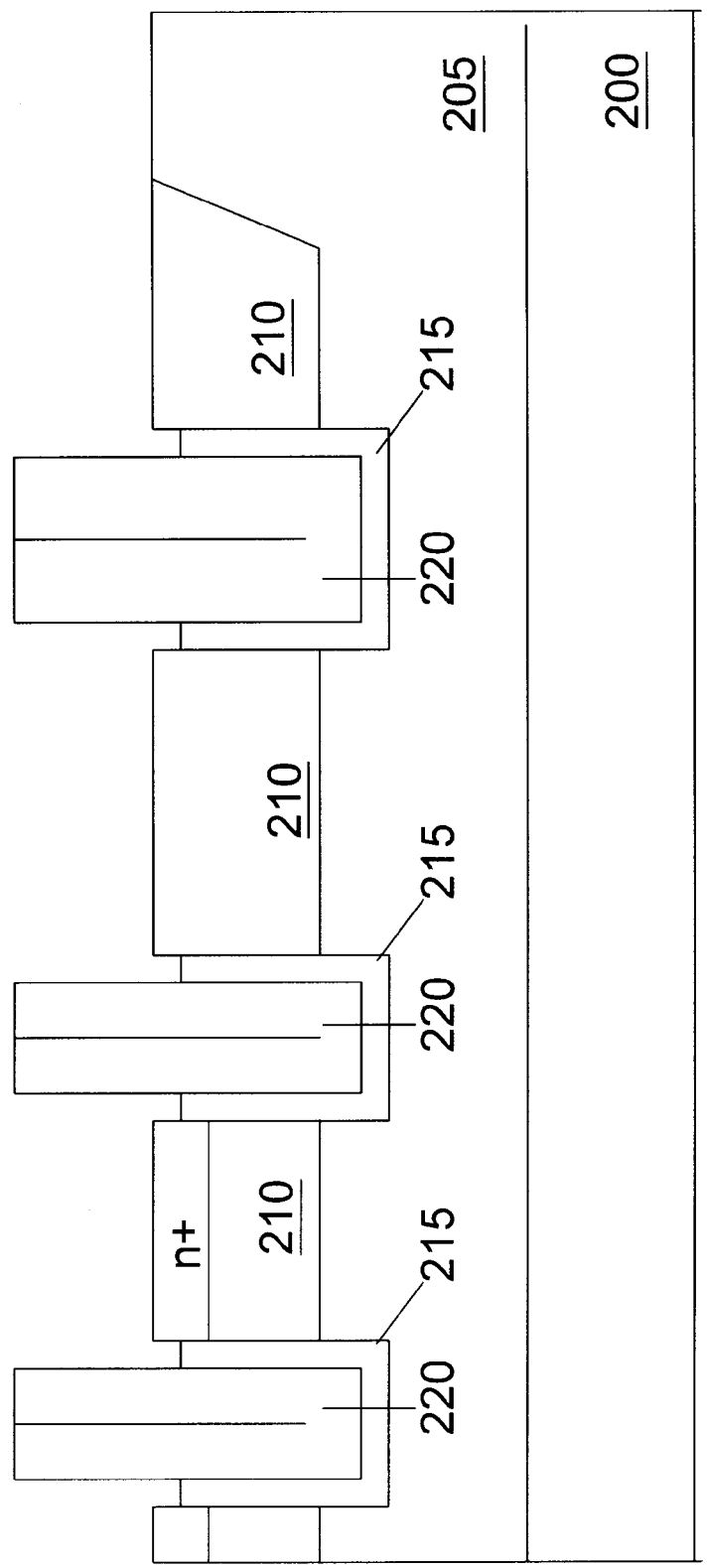

Referring to FIG. 9, a portion of the oxide layer 206 on the epitaxial layer 205 is removed by back-etching such that the gate structures terraced out of the trenches. Referring to FIG. 10, a p-type doping region 210, and an n+ doping region are formed in the epitaxial layer 205 surrounding both sides of the trenches as the source of the trench MOSFET.

Figure 11:
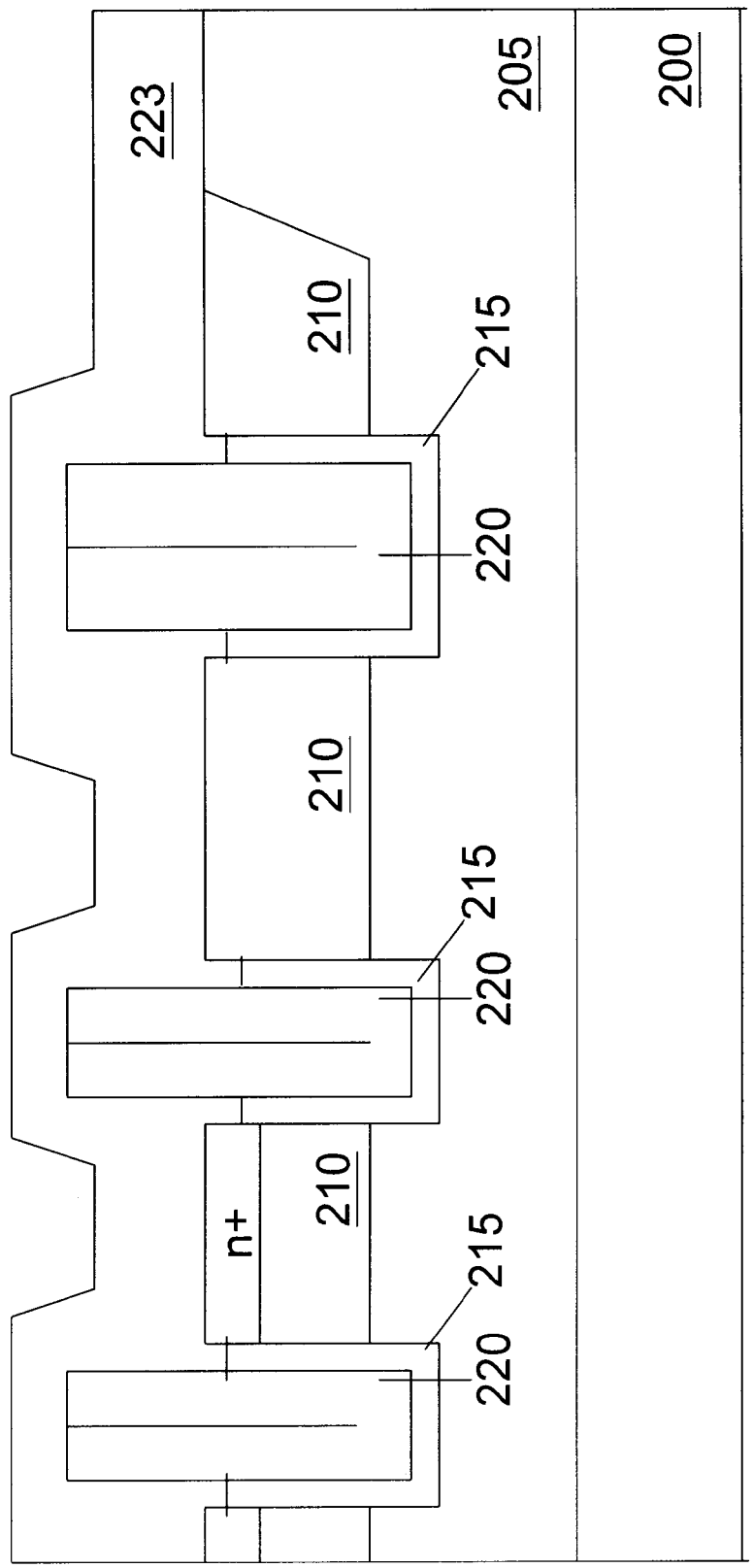
Figure 12:
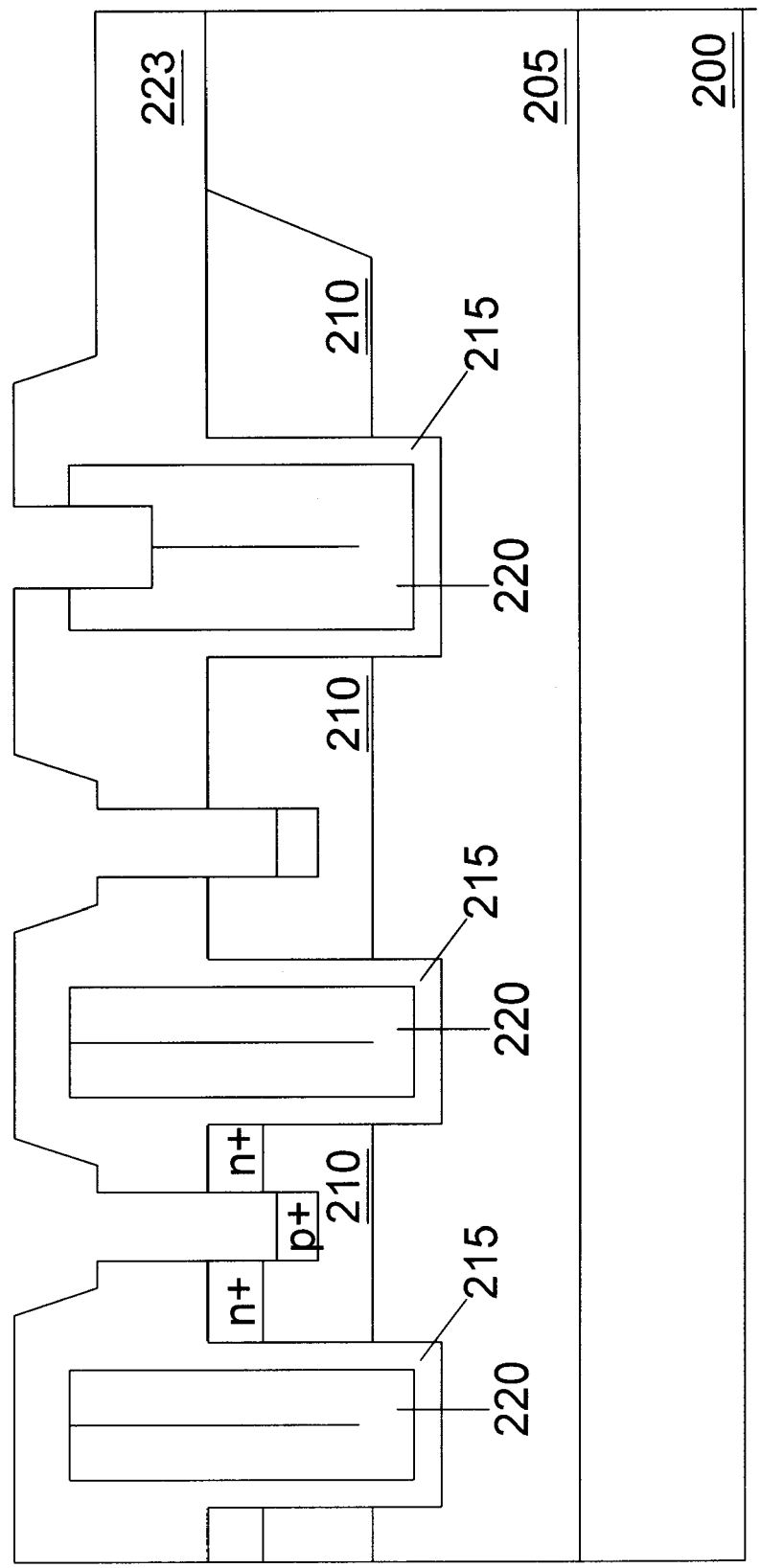

Referring to FIG. 11, an insulating layer 223 is covered on the epitaxial layer 205 and the gate structures by a CVD process. The composition of the insulating layer 223 may be Boron Phosphorus Silicon Glass (BPSG). Referring to FIG. 12, contact windows are formed in the insulating layer 223 by lithography and etching processes for contacting the source region and the gate structure 220 in the epitaxial layer 205. Thereafter, boron ions are implanted into the bottom of the trenches by ion implantation to form a p+ doping region.

Figure 13:
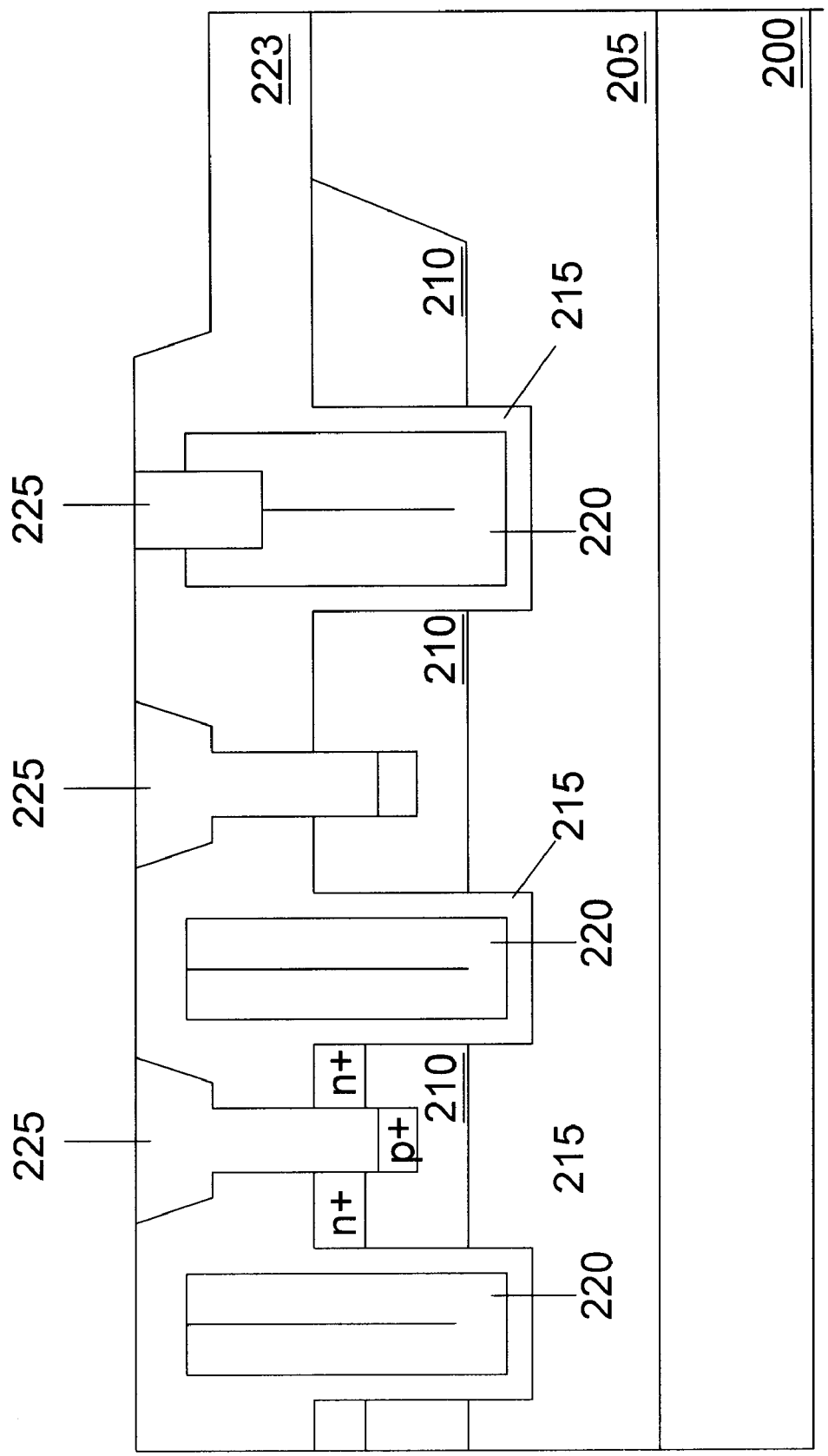

Referring to FIG. 13, metal plugs 225 are provided in the metal contact windows so as to form metal contacts for the source region and the gate structure. The metal plugs 225 directly contact the gate structure 220 and the source region. According to the embodiment of the present invention, since the gate structure 220 terrace out of the trench, making the polysilicon seam of the gate structure to be relatively longer so that the metal contact in the gate structure 220 to trench bottom is further away, thereby avoiding situations such as metal penetrating the gate structure and the oxide layer.

Figure 14:
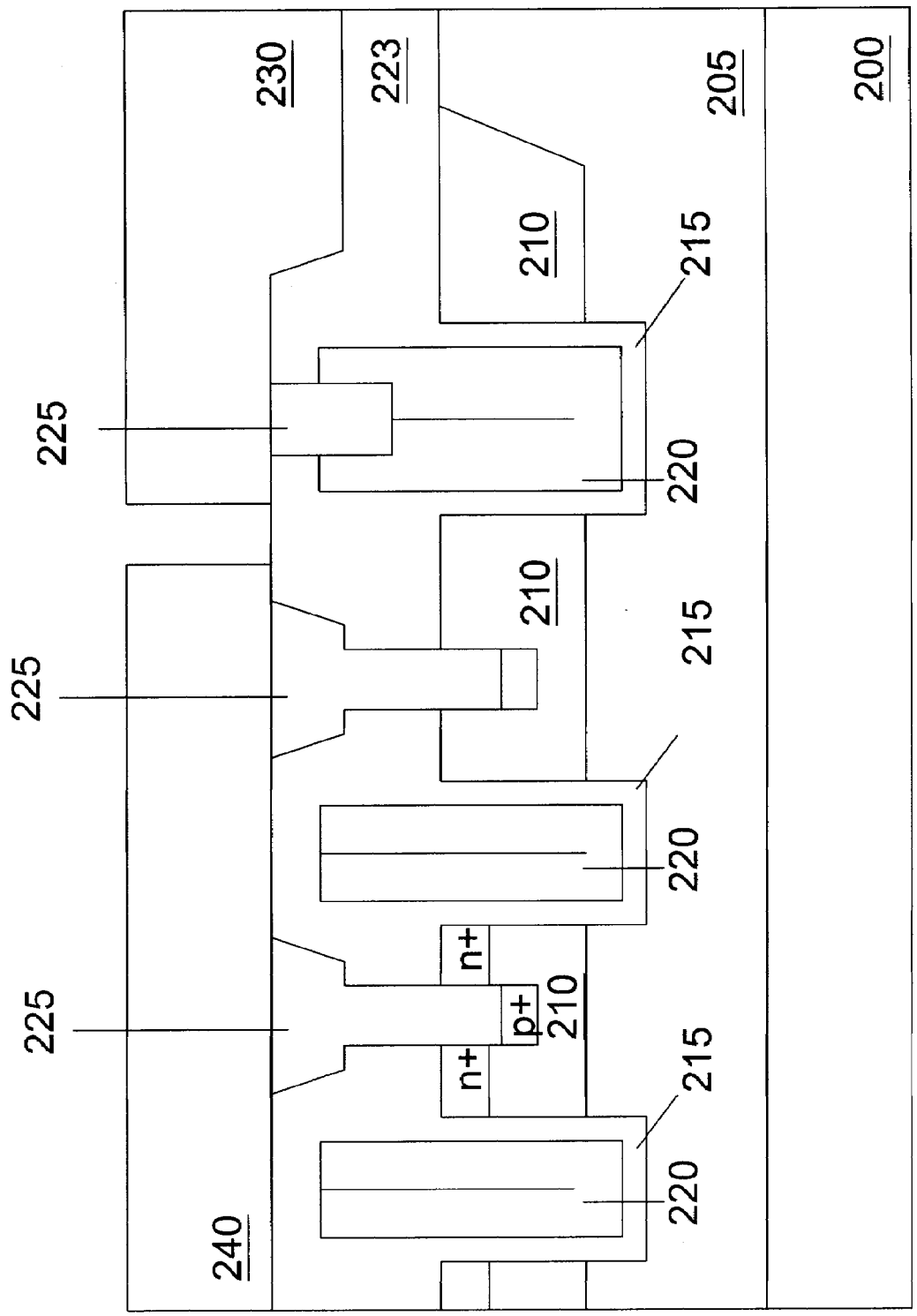

Referring to FIG. 14, a metal layer is covered on the metal plugs 225 and the insulating layer 223. Thereafter, a source metal pad 240 and a gate metal pad 230 are defined on the metal layer by lithography and etching processes, thus completing metal connections for the trench MOSFET.

Figure 15:
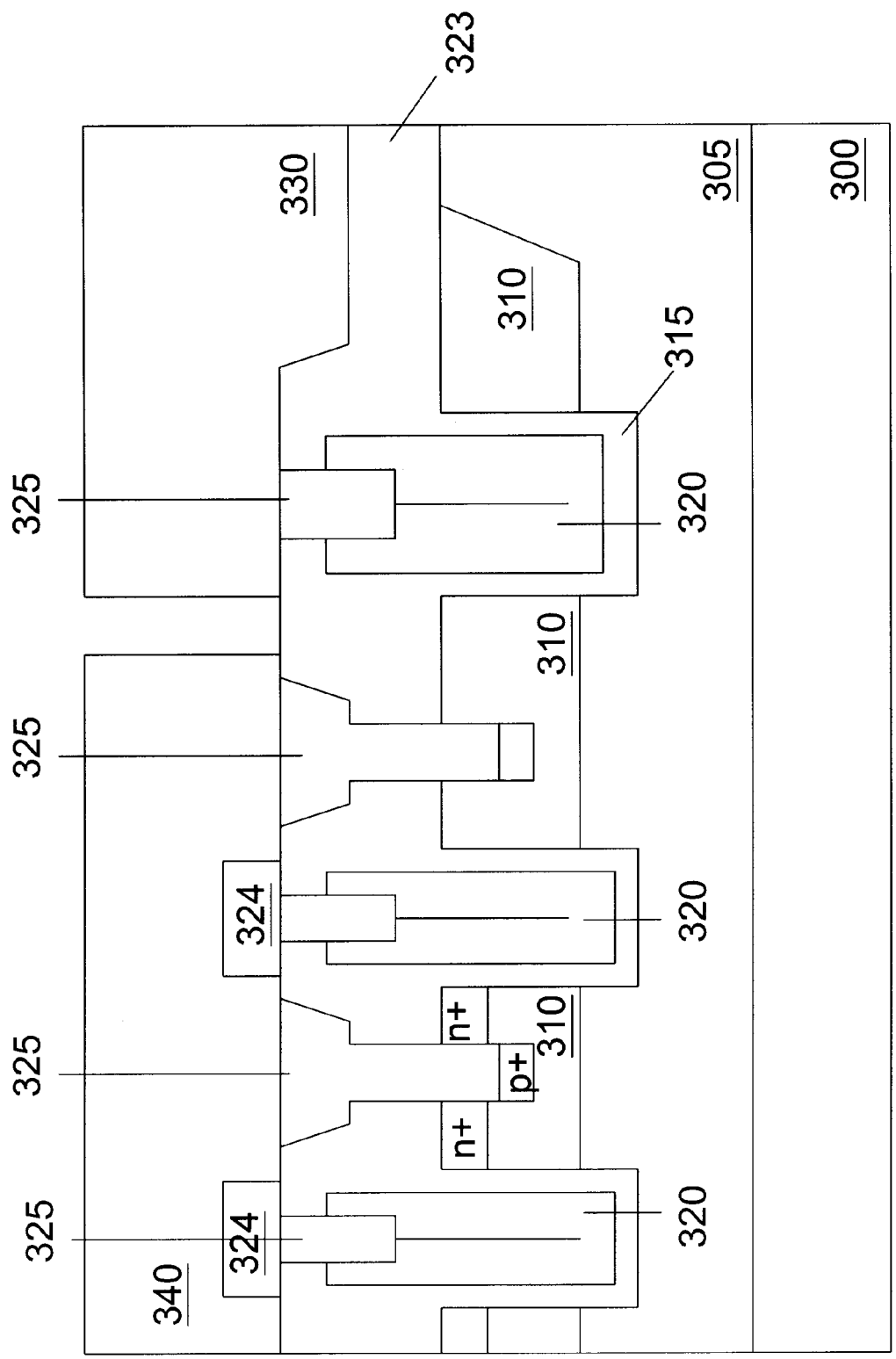
FIG. 15 is a cross-sectional schematic diagram illustrating a trench MOSFET according to a second embodiment of the present invention, wherein tungsten metal plugs are connected to a terraced gate structure and sources.

Referring to FIG. 15, a diagram depicting a trench MOSFET structure according to a second embodiment of the present invention is shown. An epitaxial layer 305 with a plurality of trenches is formed on a substrate 300. The sidewalls and the bottoms of the trenches are covered with gate oxide layer 315. Gate structures 320 are provided in the trenches and protruding out of the trenches. A doping region 310, and a n+ doping region is formed in the epitaxial layer 305 and a p+ doping region is formed at the bottom of the trench contacts. Metal contact windows filled with metal plugs 325 are disposed on the doping region and the gate structures 320 in active cells and gate runner. An oxide layer 324 is deposited, and selectively etched with a mask to avoid trench gate in active area shorting with source regions. Finally, a metal layer is covered on the oxide layer 323 and defined to form a source metal pad 340 and a gate metal pad 330 by lithography and etching processes.

Figure 16:
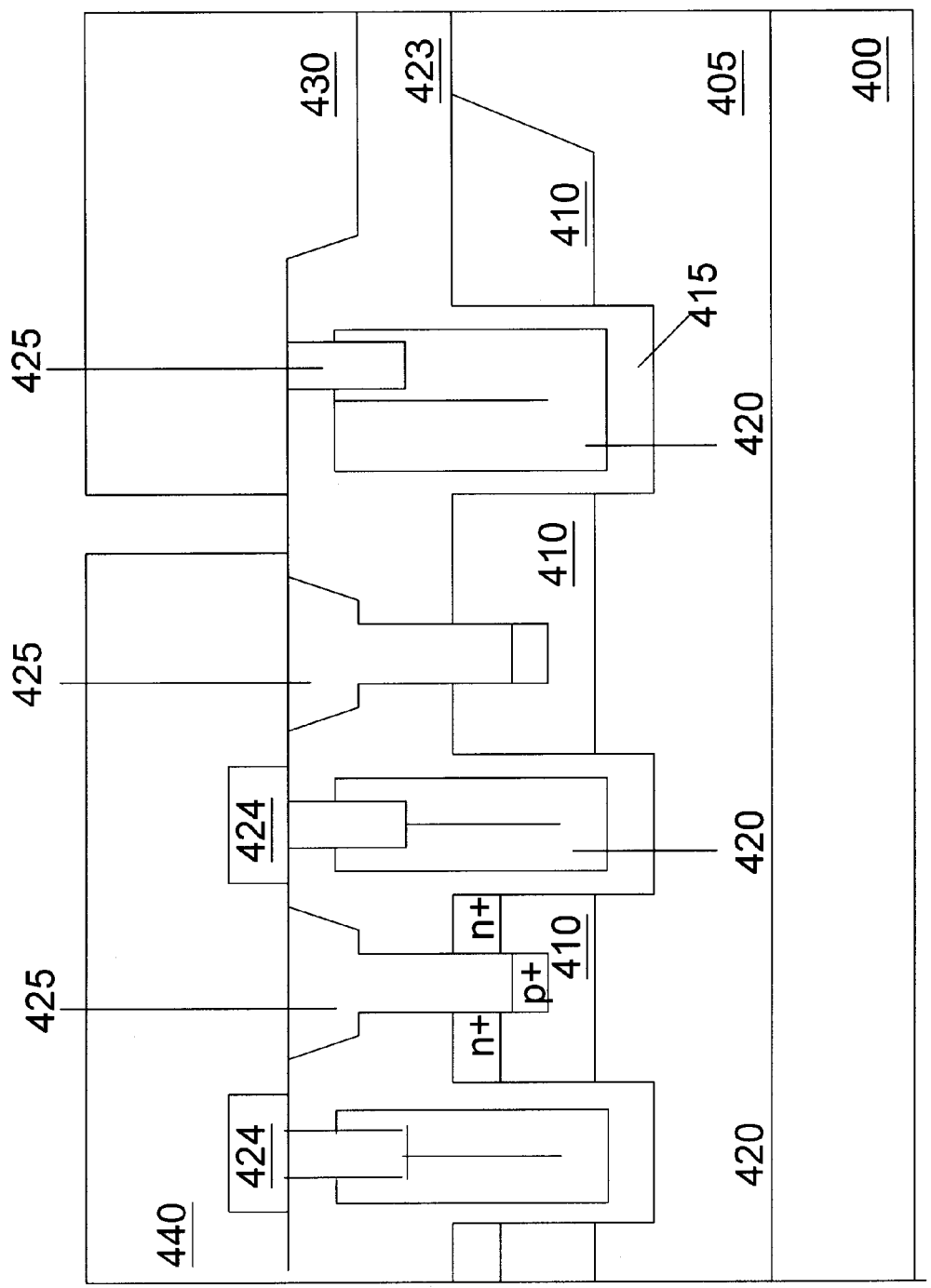
FIG. 16 is a cross-sectional schematic diagram illustrating a trench MOSFET according to a third embodiment of the present invention, wherein tungsten metal plugs are connected to a terraced gate structure while avoiding the polysilicon seam of the gate structure.

Referring to FIG. 16, a diagram depicting a trench MOSFET structure according to a third embodiment of the present invention is shown. An epitaxial layer 405 with a plurality of trenches is formed on a substrate 400. The sidewalls and the bottoms of the trenches are covered with gate oxide layer 415. Gate structures 420 are provided in the trenches and protruding out of the trenches. A doping region 410 and a n+ doping region is formed in the epitaxial layer 405 and a p+ doping region is formed at the bottom of the trench contacts. Metal contact windows filled with metal plugs 425 are disposed on the doping region and the gate structures 420. Finally, a metal layer is covered on the oxide layer 423 and defined to form a source metal pad 440 and a gate metal pad 430 by lithography and etching processes. According to the third embodiment, the metal contact window is positioned slightly to a side of gate structure 420, avoiding the polysilicon seam in the middle thereof, thus eliminating problems of metal penetration.

Figure 17:
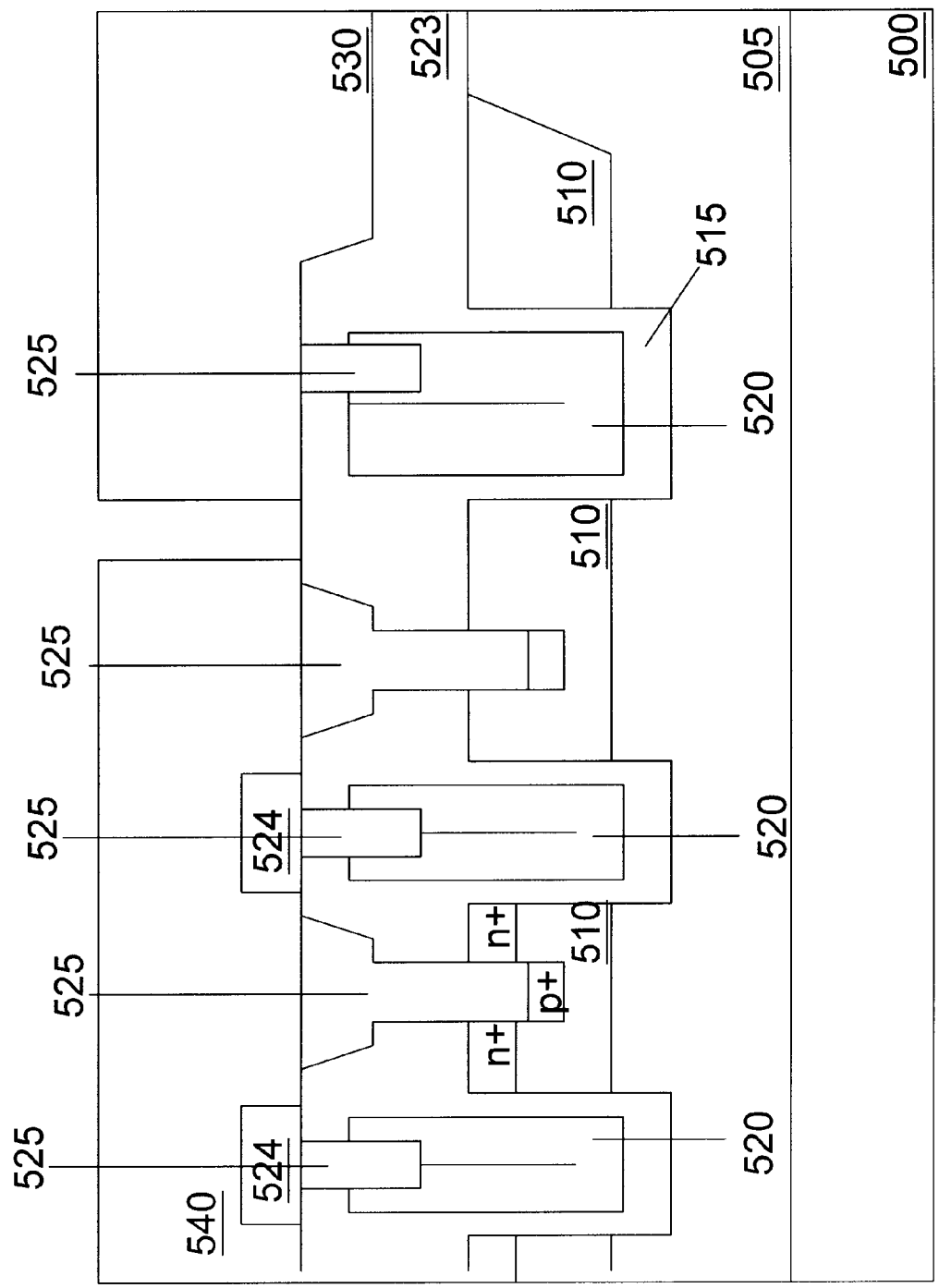
FIG. 17 is a cross-sectional schematic diagram illustrating a trench MOSFET according to a fourth embodiment of the present invention, wherein tungsten metal plugs are connected to a terraced gate structure while avoiding the polysilicon seam of the gate structure.

Referring to FIG. 17, a diagram depicting a trench MOSFET structure according to a fourth embodiment of the present invention is shown. An epitaxial layer 505 with a plurality of trenches is formed on a substrate 500. The sidewalls and the bottoms of the trenches are covered with gate oxide layer 515. Gate structures 520 are provided in the trenches and protruding out of the trenches. A doping region 510 and a n+ doping region is formed in the epitaxial layer 505 and a p+ doping region is formed at the bottom of the trench contacts. Metal contact windows filled with metal plugs 525 are disposed on the doping region and the gate structures 520 in active cells and gate runner. An oxide layer 524 is deposited, and selectively etched with a mask to avoid trench gate in active area shorting with source regions. Finally, a metal layer is covered on the oxide layer 523 and defined to form a source metal pad 540 and a gate metal pad 530 by lithography and etching processes. According to the third embodiment, the metal contact window is positioned slightly to a side of gate structure 520, avoiding the polysilicon seam in the middle thereof, thus eliminating problems of the metal penetration. Furthermore, the thickness of the oxide layer on the bottom of the gate structure 520 is larger than that on the sidewalls, reducing the capacitance of the gate oxide layer of the trench MOSFET and increasing the operating speed of the trench MOSFET.

According to an embodiment of the present invention, the metal plugs are made of tungsten metal material.

Although various embodiments are specifically illustrated and described herein, it will be appreciated that modifications and variations of the present invention are covered by the above teachings and are within the purview of the appended claims without departing from the spirit and intended scope of the invention.

What is claimed is:

1. A trench metal oxide semiconductor field effect transistor (MOSFET) with a terraced gate, comprising:
    a substrate;
    an epitaxial layer disposed on the substrate;
    a plurality of trenches each defined by at least a sidewall and a bottom formed on top of the epitaxial layer;
    a gate oxide layer formed on the sidewall and the bottom of each trench;
    a polysilicon layer disposed in the trenches, wherein the polysilicon layer protrudes out from each of the trenches and at least a portion of the polysilicon layer is positioned higher than the sidewall of each of the trenches;

a plurality of source regions and body regions formed in the epitaxial layer such that the polysilicon layer that is disposed in the trenches surrounded by the source regions is configured to conduct current of the MOSFET;

an insulating layer deposited on the epitaxial layer, a plurality of metal contact holes formed in the insulating layer and extending through the insulating layer, the source regions and into the body regions vertically relative to a surface of the epitaxial layer for contacting respective source and body regions for source metal connection;

a plurality of metal contact holes formed in the insulating layer and extending through the insulating layer and into the polysilicon layer in the trenches for gate metal connection; and metal plugs disposed in the metal contact holes to form the source metal connection and the gate metal connections for the MOSFET.

2. The MOSFET of claim 1, wherein the metal contact holes in the polysilicon layer for the gate metal connection avoids polysilicon seam regions in the middle of the polysilicon layer.

3. The MOSFET of claim 1, wherein the metal plugs connected to the metal contact holes for the source metal connection are made of tungsten metal materials surrounded by barrier metals along both a sidewall and a bottom of each of the metal contact holes for connecting the respect source and body regions.

4. The transistor of claim 1, wherein the gate oxide layer in trench gates is single oxide of which oxide thickness nearly uniform along trench sidewall and bottom.

5. The transistor of claim 1, wherein the gate oxide layer at the bottoms of trench gates has a significant larger thickness than trench sidewall so as to reduce the capacitance of the gate oxide layer.

* * * * *